United States Patent [19]

Zisa

[11] 4,424,485

[45] Jan. 3, 1984

[54] FIXED LIGHT LOAD ADJUSTMENT ASSEMBLY FOR INDUCTION METERS

[75] Inventor: William J. Zisa, Cary, N.C.

[73] Assignee: Westinghouse Electric Corp., Pittsburgh, Pa.

[21] Appl. No.: 272,243

[22] Filed: Jun. 10, 1981

[51] Int. Cl.³ ............................................. G01R 11/02
[52] U.S. Cl. ................................................. 324/137
[58] Field of Search ................ 324/136, 137, 138, 139

[56] References Cited

U.S. PATENT DOCUMENTS 2,871,421  1/1959  Schmidt ............................. 324/138
4,213,090  7/1980  Keever et al. ...................... 324/138

FOREIGN PATENT DOCUMENTS 867571   2/1953  Fed. Rep. of Germany.
2356132  5/1975  Fed. Rep. of Germany.
483022  12/1969  Switzerland.
582561  11/1946  United Kingdom.

*Primary Examiner*—Gerard R. Strecker
*Assistant Examiner*—Warren S. Edmonds

[57] ABSTRACT

An induction meter having a voltage magnetic section comprised of a substantially E-shaped laminated magnetic core having a center leg terminating at a main pole face and two adjacent legs terminating at coplanar auxiliary pole faces on opposite sides of the main pole face provides a fixed light load adjuster bracket located in magnetic proximity to the first side of the core. The bracket has a fixed tab extending over a portion of one of the auxiliary pole faces. A nonmagnetic spacer is located between the first side of the core and the light load adjuster bracket. The spacer, the light load adjuster bracket and the laminae of the core are fastened together so as to provide a rigid assembly. The light load adjuster bracket carries a movable tab extending over adjustable portions of the other auxiliary pole face and the main pole face thereby providing an adjustable magnetic flux shunt path. The light load adjuster bracket together with both the fixed tab and the movable tab act as an additional magnetic flux shunt path.

8 Claims, 3 Drawing Figures

U.S. Patent   Jan. 3, 1984   4,424,485
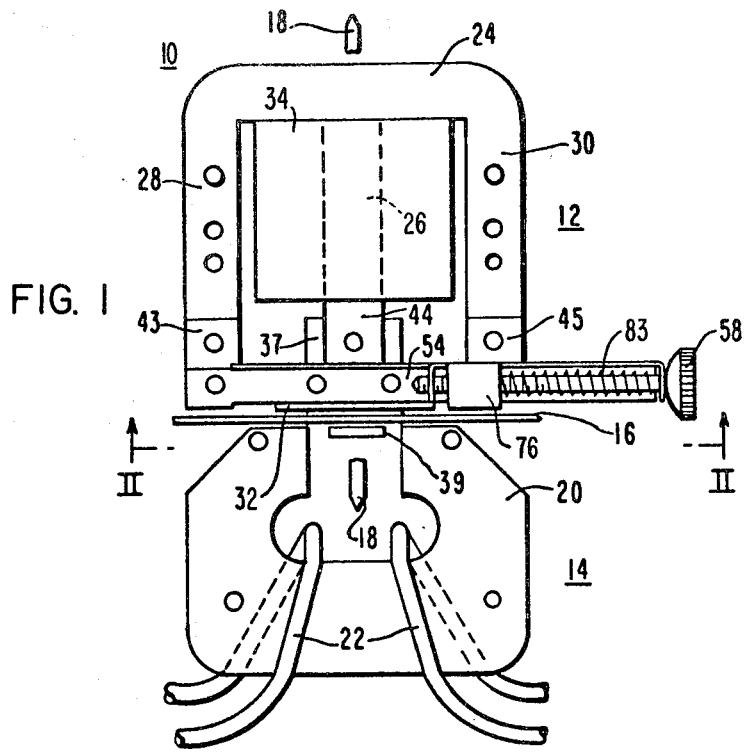
FIG. 1
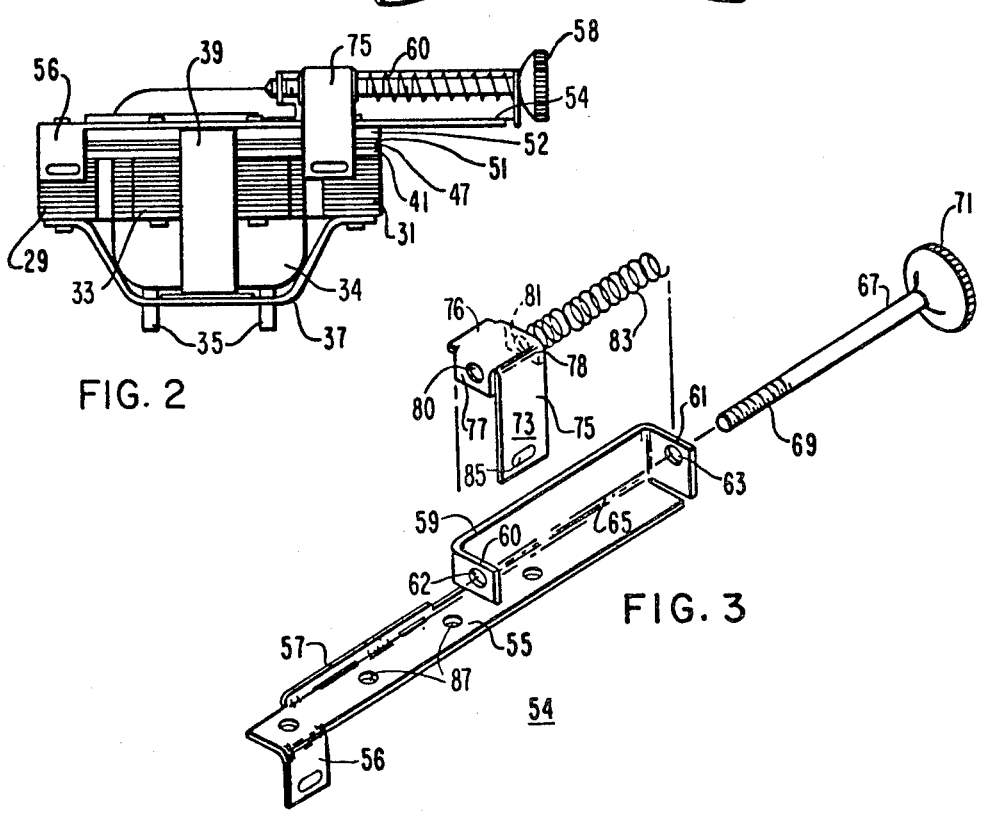
FIG. 2
FIG. 3

FIXED LIGHT LOAD ADJUSTMENT ASSEMBLY FOR INDUCTION METERS

BACKGROUND OF THE INVENTION

Field of the Invention

This invention relates to induction meters having an electromagnetic assembly including a voltage magnetic section and a current magnetic section, and more particularly, to the voltage magnetic section of such a meter having an integral, fixed, light load adjustment assembly.

DESCRIPTION OF THE PRIOR ART

Induction meters such as watthour meters are almost universally used for billing and load monitoring of AC electric energy transmitted by an electric energy supplier to residential and commercial electricity users. Voltage and current magnetic sections which comprise the meter's electromagnetic assembly produce magnetic fluxes responsive to line voltage and line current. The magnetic fluxes are directed into an electroconductive disk which rotates in response to the consumption of AC electric energy. In the manufacture and design of watthour meter electromagnetic assemblies, it is known to provide adjustments on the voltage magnetic section so that the voltage and current fluxes rotate the disk at a calibrated rate or speed having a predetermined ratio to the consumption of electric energy as measured in kilowatt hours. The ratio of the disk speed to the measured electric energy is often referred to as the watthour constant of the meter.

Correction and adjustment of the power factor or voltage flux phase lag and light load characteristics are two common calibrating adjustments of induction watthour meters. The calibrations are used to provide operation in accordance with the well-known basic theory of operation of induction watthour meters which includes the principle that the magnetic flux from the voltage section, being responsive to the line voltage, must lag the magnetic flux from the current section, being responsive to the line current, by ninety electrical degrees when the line voltage and current are in phase at unity power factor. In modern watthour meters, the voltage and current fluxes are directed in this quadrature phase relationship in opposing directions into an airgap and into opposite sides of the meter disk which is located in the airgap. The fluxes produce eddy currents in localized areas of the disk. In accordance with the aforementioned basic theory, interaction of the eddy currents with the voltage and current magnetic fluxes develops a torque on the meter disk in proportion to the measured electrical energy.

The voltage magnetic section typically has an E-shaped magnetic core carrying a coil having a large number of winding turns of a small conductor on the center leg thereof. The voltage coil has substantial inductance so that the voltage airgap flux produced by the coil will substantially lag the line voltage, but not by the required ninety degrees without further adjustment. To provide the additional flux lagging adjustment, it is known to provide a loop of conductive material around the voltage flux so that circulating current is induced therein to establish a further voltage flux component that is vectorially added to the voltage coil main flux component to produce a corrected working voltage flux in the airgap. The resultant airgap voltage flux has substantially the aforementioned ninety degrees or quadrature lagging relationship with the line voltage and current flux at unity power factor.

Light load adjustment differs from the phase lag adjustment so that at low values of line current an asymmetrical component of voltage flux will add torque to the meter disk. A part of the light load adjustment compensates for the slight frictional drag on the shaft which carries the meter disk and another part compensates for the non-linear and lower permeability characteristics of the laminated magnetic core materials at low magnetic induction causing the line currrent related flux to be disproportionately low. Compensation and calibration of the light load adjustment in the voltage magnetic section of some electromagnetic assemblies is related to the regulation of the disk torque produced by the magnetic drive effects of an asymmetrical voltage flux path established between the main center voltage pole face and a pair of auxiliary voltage pole faces. A secondary voltage flux path is divided and extends between the disk and the pair of auxiliary voltage pole faces formed at the free ends of the opposite legs of the E-shaped voltage core on opposite sides of the main voltage pole face. The secondary flux path produces a large magnetic flux shunting circuit to carry the leakage or the non-driving component of the voltage flux. A light load adjuster is described in U.S. Pat. No. 2,947,942 which includes two magnetic members movable over the auxiliary pole faces. The magnetic members produce dissymmetry in the disk driving flux by producing affects in the driving flux path in a predetermined adding or subtracting relationship (depending on the position) to the main driving torque on the disk. The magnetic members are movably mounted on a brass bracket fastened to the meter electromagnetic assembly. The bracket also carries a threaded adjusting member to move the magnetic members.

In U.S. Pat. No. 3,493,862, a light load adjuster is described including soft magnetic members carried by a nonmagnetic bracket. The magnetic members are pivotally mounted on the brackets so that the ends of the members extend over the faces of the voltage flux arms to vary light load calibrations. U.S. Pat. No. 4,213,090, is for a voltage magnetic section of a watthour meter having a voltage flux lagging loop formed integrally with a platform part directly attached to the voltage magnetic core. Light load adjustment members are movably mounted on the platform which also carries a manual operator for shifting the light load members to a predetermined position for proper operation in the meter.

SUMMARY OF THE PRESENT INVENTION

In accordance with the present invention an induction meter includes an electromagnetic assembly having a current magnetic section and a voltage magnetic section each producing magnetic flux in response to line current and line voltage, respectively. An electroconductive disk is driven at a rate responsive to the magnetic flux directed from the magnetic sections. The voltage magnetic section is comprised of a substantially E-shaped laminated magnetic core having a center leg terminating at a main pole face and two adjacent legs terminating at coplanar auxiliary pole faces on opposite sides of the main pole face. A first and a last laminae define a first and a second side, respectively, of the core. A voltage coil is wound about the center leg of the voltage core.

A fixed light load adjuster bracket is located in magnetic proximity to the first side of the voltage core. The bracket has a fixed tab extending over a portion of one of the auxiliary pole faces. A nonmagnetic spacer is located between the first side of the voltage core and the light load adjuster bracket. The bracket has two perpendicular extensions each having an unthreaded opening therethrough for carrying a screw. A movable tab has a threaded portion which cooperates with the screw. The movable tab is oriented so as to extend over adjustable portions of the other auxiliary pole face and the main pole face thereby providing an adjustable magnetic flux shunt path. The bracket together with both the fixed and the movable tabs acts as an additional magnetic flux shunt path. Finally, the fixed light load adjuster bracket, the nonmagnetic spacer and the laminae of the magnetic core all have corresponding opening therethrough for receiving rivets thereby providing a solid assembly. The voltage assembly taught by the present invention is easily assembled and extremely resistant to mechanical shock and vibration.

Completing the description of the induction meter, a power factor bracket extends from the second side of the voltage core. A flux return tongue is carried by the power factor bracket and located opposite the main pole face a predetermined space therefrom. The electroconductive disk rotates in the space between the power factor bracket and the main pole face.

BRIEF DESCRIPTION OF THE DRAWINGS

FIG. 1 is a front elevational view of an electromagnetic assembly of an induction meter including a current magnetic section and a voltage magnetic section having a fixed light load adjustment assembly constructed according to the teachings of the present invention;

FIG. 2 is a cross sectional view of FIG. 1 taken along the axis II—II and looking in the direction of the voltage magnetic section; and FIG. 3 is a perspective view with parts exploded, of a fixed light load adjustment assembly.

DESCRIPTION OF THE PREFERRED EMBODIMENT

Referring to FIG. 1, there is shown an electromagnetic assembly of a single phase induction watthour meter 10 for measuring the electric energy transmitted from an electric energy supplier to a customer thereof. While the following description is made in conjunction with the induction watthour meter 10, the teachings of the present invention need not be limited thereto. The present invention is equally applicable to multi-phase meters, and to induction meters capable of measuring quantities other than watthours.

The single stator electromagnetic assembly of the meter 10 includes a voltage magnetic section 12 and a current magnetic section 14 carried by a frame (not shown). An electroconductive disk 16 is carried by a shaft 18 (partially shown) for rotation in a predetermined gap between the voltage and current magnetic sections 12 and 14, respectively.

The current magnetic section 14 is comprised of a laminated C-shaped magnetic core 20 and current coils 22 formed of a large diameter conductor. The current coils 22 are connectable in a conventional manner in series with an AC line current component of an electrical energy quantity to be measured.

The voltage magnetic section 12 is comprised of an E-shaped laminated magnetic core 24 having a center leg 26, a first adjacent leg 28 terminating in a first auxiliary pole face 29 (shown in FIG. 2) and a second adjacent leg 30 terminating in a second auxiliary pole face 31 (shown in FIG. 2). The first and second adjacent legs 28 and 30, respectively, are disposed on opposite sides of the center leg 26. The first and second auxiliary pole faces 29 and 31, respectively, are coplanar. The center leg 26 cooperates with an expanded laminated magnetic pole piece having a first portion (not visible) substantially colinear with the center leg 26 and a second portion 32 substantially perpendicular to the center leg 26. The second portion 32 terminates in a main pole face 33 (shown in FIG. 2). The center leg 26 carries a voltage coil 34 enclosed within a protective encapsulating material and having terminals 35 (shown in FIG. 2) connectable in a conventional manner so as to receive an AC line voltage component of the electric energy quantity to be measured.

When the voltage coil 34 and the current coils 22 are properly energized from the AC line voltage and current components, respectively, of the AC electric energy quantity to be measured, the main pole face 33 of the E-shaped magnetic core 24 and one of the pole faces of the C-shaped magnetic core 20 become sources of magnetic flux. A working voltage flux component and a working current flux component flow from the respective pole faces into the airgap and into the disk 16. The working airgap voltage and current fluxes produce eddy currents in the disk 16 which interact with the fluxes to develop a resultant torque acting to drive the disk 16 and the shaft 18. The torque on the disk 16 produces a rate of rotation or speed that is dependent upon the product of the AC line voltage and current components and the phase angle therebetween. The rotation of the disk 16 and shaft 18 may be employed in a suitable manner for indicating the measured electric energy such as by a dial register (not shown) connected to the shaft 18. Such measurement is well known and does not form an important feature of the present invention.

Turning now to a more detailed description of the voltage magnetic section 12, the first and last laminae of the magnetic core 24 define a first and a second side, respectively. The first side of the magnetic core 24 is illustrated in FIG. 1. As shown in FIG. 2, the second side of the magnetic core 24 has a power factor bracket 37 extending therefrom. The power factor bracket 37 carries a flux return tongue 39. The flux return tongue 39 is located opposite the main pole face 33 with a predetermined spaced relationship therebetween as can be seen in FIG. 1. The electroconductive disk 16 (not shown in FIG. 2) rotates in the predetermined space. The power factor bracket 37 and the flux return tongue 39 provide a magnetic flux path for returning voltage magnetic flux to the core 24.

The components adjacent to the first side of the voltage core 24 are also shown in FIG. 2. A nonmagnetic, multi-function support and spacer bracket 41 extends from the first adjacent leg 28 to the second adjacent leg 30. The bracket 41 is oriented so as to have one edge substantially coplanar with the auxiliary pole faces 29 and 31. The bracket 41 has three perpendicular extensions 43, 44 and 45 (seen in FIG. 1) giving the bracket 41 an E-shape. The first perpendicular extension 43 corresponds to the first adjacent leg 28; the second and third perpendicular extensions 44 and 45 correspond to the center leg 26 and the second adjacent leg 30, respectively. The second perpendicular extension 44 provides support for the voltage coil 34. The bracket 41 additionally acts as a nonmagnetic spacer between the first side of the voltage core 24 and a voltage shunting member 47.

The voltage shunting member 47 is located in magnetic proximity with the main pole face 33, the first auxiliary pole face 29 and the second auxiliary pole face 31 thereby providing a magnetic flux shunt path for a predetermined amount of magnetic flux depending upon the thickness of the bracket 41.

A first nonmagnetic spacer 51 and a second nonmagnetic spacer 52 provide a predetermined space between the voltage shunting member 47 and a fixed light load adjuster bracket 54. The fixed light load adjuster bracket 54 is located in magnetic proximity to the first side of the voltage core 24. The fixed light load adjuster bracket 54, illustrated in detail in FIG. 3, has a main body 55 carrying a fixed tab 56 which extends over a portion of the first auxiliary pole face 29. The main body 55 also carries a strengthening rib 57, a portion of which is extended to provide a platform 59. The platform 59 carries a first perpendicular extension 60 and a second perpendicular extension 61 which form a support for a screw 67. Each of the perpendicular extensions 60 and 61 has an unthreaded opening therethrough 62 and 63, respectively. The openings 62 and 63 are concentric as shown by the broken line 65.

The screw 67 extends through the unthreaded openings 62 and 63 such that the screw is carried by the first and second perpendicular extension 60 and 61, respectively. The screw 67 has a threaded portion 69 which is located between the first and second perpendicular extensions 60 and 61, respectively, and a head 71. A movable tab or slider 73 has a main body 75 carrying a perpendicular upright 76. The perpendicular upright 76 carries a first perpendicular extension 77 having a first threaded opening 80 therethrough, and carries a second perpendicular extension 78 having an unthreaded opening 81 therethrough. The first threaded opening 80 and the unthreaded opening 81 are concentric. The movable tab 73 is carried by the screw 67. The threaded opening 80 cooperates with the threaded portion 69 of the screw such that the position of the movable tab 73 may be varied. By turning the screw 67, the movable tab 73 extends over adjustable portions of the main pole face 33 and the second auxiliary pole face 31. In this manner, the movable tab 73 provides an adjustable shunt path for magnetic flux between the aforementioned pole faces. Additionally, the main body 55 of the fixed light load adjuster bracket 54 together with both the fixed tab 56 and the movable tab 73 provide an additional mangetic flux shunt path.

Concluding the description of FIG. 3, a spring 83 is carried by the screw 67 and located between the second perpendicular extension 78 of the movable tab 73 and the second perpendicular extension 61 of the fixed light load adjuster bracket 54. The spring 83 is in various stages of compression depending upon the location of the movable tab 73. The spring 83 provides a force upon the movable tab 73 so as to prevent undesirable movement of the tab 73. The main body 75 of the movable tab 73 has a raised portion 85 facing the main pole face 33 and the second auxiliary pole face 31 to improve the mechanical contact between the movable tab 73 and the aforementioned pole faces.

The main body 55 of the fixed light load adjuster bracket 54 has a plurality of openings 87 therethrough. The first and second nonmagnetic spacers 51 and 52, the voltage shunting member 47, the multi-function support bracket 41, the power factor bracket 37 and the laminae of the magnetic core 24 all have corresponding openings therethrough such that all the components of the voltage magnetic section 12 may be riveted together thereby providing an extremely rigid and reliable voltage magnetic section. The above described voltage magnetic section 12 is easily assembled and extremely resistant to damage due to mechanical shock.

What we claim is:

1. An induction meter including a voltage and current magnetic sections each producing magnetic flux and a rotatable disk driven at a rate responsive to said magnetic flux directed from said magnetic sections into said disk, wherein said voltage magnetic section comprises:

a substantially E-shaped laminated magnetic core having a center leg terminating at a main pole face and two adjacent legs terminating at coplanar auxiliary pole faces on opposite sides of said main pole face, said first and last laminae defining a first and a second side, respectively, of said core;

a voltage coil wound about said center leg;

a fixed light load adjuster bracket located in magnetic proximity to said first side, said bracket having a fixed tab extending over a portion of one of said auxiliary pole faces and means for supporting a screw;

a non-magnetic spacer separate from said light load adjuster bracket located between said first side and said light load adjuster bracket, said spacer, said light load adjuster bracket and said laminae of said core being fastened together so as to provide a rigid assembly;

a screw carried by said bracket screw support means; and a movable tab located in proximity to said bracket and having a threaded portion cooperating with said screw, said movable tab being oriented so as to extend over adjustable portions of said other auxiliary pole face and said main pole face thereby providing an adjustable magnetic flux shunt path, said bracket and said tabs acting as an additional magnetic flux shunt path.

2. The meter of claim 1 wherein the light load adjuster bracket has two extensions each having an unthreaded opening therethrough, and wherein the threaded portion of the screw is located between said extensions.

3. The meter of claim 2 including a spring carried by the screw and located between the movable tab and one of the extensions.

4. The meter of claim 1 wherein the movable tab has a raised portion so as to improve the mechanical contact between said movable tab and the main and auxiliary pole faces.

5. The meter of claim 1 wherein the fixed light load adjuster bracket, the nonmagnetic spacer and the laminae of the core all have corresponding openings therethrough receiving rivets thereby providing a solid assembly.

6. The meter of claim 1 including a power factor bracket extending from the second side of the magnetic core.

7. The meter of claim 6 including a flux return tongue carried by the power factor bracket, said tongue located opposite the main pole face and maintaining a spaced relationship therewith in which the disk rotates.

8. The meter of claim 1 including a voltage shunting member adjacent said nonmagnetic spacer, and including a second nonmagnetic spacer separating said voltage shunting member and the light load adjuster bracket.

* * * * *